(12) United States Patent
Nishikawa

(10) Patent No.: US 8,563,382 B2
(45) Date of Patent: Oct. 22, 2013

(54) SEMICONDUCTOR DEVICE

(75) Inventor: Masatoshi Nishikawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1 day.

(21) Appl. No.: 13/413,654

(22) Filed: Mar. 7, 2012

(65) Prior Publication Data

US 2012/0164806 A1 Jun. 28, 2012

Related U.S. Application Data

(62) Division of application No. 12/878,364, filed on Sep. 9, 2010, now Pat. No. 8,222,706.

(30) Foreign Application Priority Data

Sep. 10, 2009 (JP) ................................. 2009-209738

(51) Int. Cl.
*H01L 21/336* (2006.01)

(52) U.S. Cl.
USPC ........... 438/285; 438/305; 438/300; 438/303; 438/299; 257/408; 257/E21.409; 257/E21.307

(58) Field of Classification Search
USPC ................. 438/285, 305, 300, 299, 303, 226; 257/408, E21.409, E21.437
See application file for complete search history.

(56) References Cited

U.S. PATENT DOCUMENTS

| 6,709,909 | B2 | 3/2004 | Mizuno et al. | |
|---|---|---|---|---|
| 7,605,042 | B2 | 10/2009 | Kohyama | |
| 8,338,831 | B2 | 12/2012 | Tamura et al. | |
| 2008/0023773 | A1* | 1/2008 | Shimamune et al. | 257/377 |
| 2008/0157119 | A1* | 7/2008 | Tsai | 257/190 |
| 2010/0093147 | A1* | 4/2010 | Liao et al. | 438/300 |

FOREIGN PATENT DOCUMENTS

| JP | 2003-243532 | 8/2003 |
|---|---|---|
| JP | 2006-319326 | 11/2006 |
| JP | 2008-047586 | 2/2008 |
| WO | WO-2009-093328 A1 | 7/2009 |

OTHER PUBLICATIONS

USPTO, (LAM) Restriction Requirement, Jan. 26, 2012, in parent U.S. Appl. No. 12/878,364 [pending].
USPTO [LAM] Notice of Allowance and Fees Due issued May 11, 2012 in parent U.S. Appl. No. 12/878,364 [pending].

* cited by examiner

*Primary Examiner* — Thinh T Nguyen
(74) *Attorney, Agent, or Firm* — Fujitsu Patent Center

(57) ABSTRACT

A semiconductor device includes, a gate insulating film, a gate electrode, a source/drain region, and a Si mixed crystal layer in the source/drain region. The Si mixed crystal layer includes a first Si mixed crystal layer that includes impurities with a first concentration, a second Si mixed crystal layer formed over the first Si mixed crystal layer and that includes the impurities with a second concentration higher than the first concentration, and a third Si mixed crystal layer formed over the second Si mixed crystal layer and that includes the impurities with a third concentration lower than the second concentration.

5 Claims, 22 Drawing Sheets

US 8,563,382 B2

SEMICONDUCTOR DEVICE

CROSS REFERENCE TO RELATED APPLICATIONS

This application is a divisional of application Ser. No. 12/878,364, filed Sep. 9, 2010, which claims the benefit of priority from the prior Japanese Patent Application No. 2009-209738, filed on Sep. 10, 2009, the entire contents of which is incorporated herein by reference.

FIELD

The disclosure generally relates to a semiconductor device, in particular to a transistor that includes a buried silicon (Si) mixed crystal layer in source/drain regions.

BACKGROUND

With high-integration and miniaturization of semiconductor devices, techniques that form buried source/drain regions by forming a recessed portion in source/drain forming regions and forming a semiconductor layer in the recessed portion by crystal growth are disclosed in Japanese Laid-open Patent Publication Nos. 2006-319326, 2008-047586, and 2003-243532 etc.

In a p-channel MOSFET, enhancing performance of a transistor is proposed in which compressive stress is applied to a channel region by epitaxially grown a SiGe layer in source/drain regions. As a countermeasure for junction capacity in a p-channel MOSFET, Japanese Laid-open Patent Publication No. 2006-319236 discloses that implanting Boron (B) to a semiconductor substrate to form a p-type diffusion region with a concentration of approximately $1 \times 10^{18}$ cm$^{-3}$ before a SiGe layer is epitaxially grown.

On the other hand, in an n-channel MOSFET, burying a SiGeC layer in source/drain regions is proposed in Japanese Laid-open Patent Publication No. 2003-243532.

FIG. 9 is a sectional view of a major portion of a MOSFET including a SiGe source/drain. A gate insulating film 82 and a gate electrode 83 are formed over an n-type well region 81, a sidewall 84 is formed, and a p-type extension region 85 is formed. A p-type diffusion region 87 is formed in order to reduce junction capacity after forming a sidewall 86.

A trench portion is formed by etching source/drain forming regions and a p-type SiGe layer 88 is epitaxially grown in the trench portion.

SUMMARY

According to an aspect of the invention, a semiconductor device includes, a gate insulating film, a gate electrode, a source/drain region, and a Si mixed crystal layer in the source/drain region. The Si mixed crystal layer includes a first Si mixed crystal layer that includes impurities with a first concentration, a second Si mixed crystal layer formed over the first Si mixed crystal layer and that includes the impurities with a second concentration higher than the first concentration, and a third Si mixed crystal layer formed over the second Si mixed crystal layer and that includes the impurities with a third concentration lower than the second concentration.

The object and advantages of the invention will be realized and attained by at least the elements, features, and combinations particularly pointed out in the claims. It is to be understood that both the foregoing general description and the following detailed description are exemplary and explanatory and are not restrictive of the invention, as claimed.

DESCRIPTION OF EMBODIMENTS

In a MOSFET including a SiGe source/drain, increasing a B concentration in a SiGe crystal is effective to reduce parasitic resistance at a junction between source/drain regions and an extension region. However, implanting B of approximately $1 \times 10^{21}$ cm$^{-3}$ into SiGe crystal causes, for example, a stacking fault as a crystal defect. Accordingly, B diffuses into the semiconductor substrate from the stacking fault and there is a disadvantage in which a leakage current from the source/drain layers to the semiconductor substrate increases. Conversely, reducing a B concentration increases parasitic resistance at the junction between the source/drain regions and the extension region.

Figure 1:
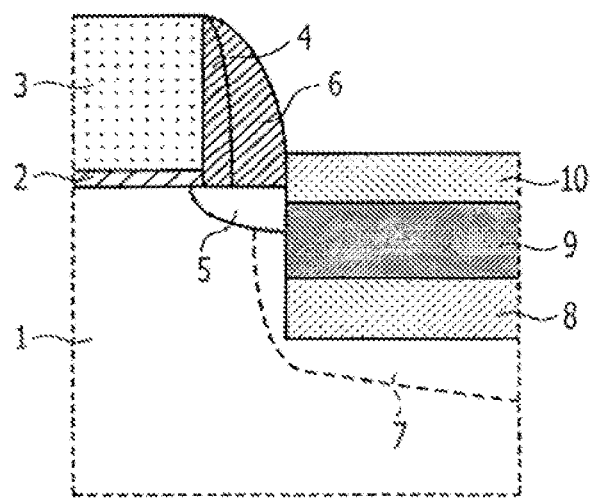
FIG. 1 is a sectional view of a major portion of a semiconductor device according to an embodiment.

The semiconductor device according to an embodiment will be described by referring to FIGS. 1 to 7. FIG. 1 is a sectional view of a major portion of a semiconductor device according to an embodiment. As illustrated in FIG. 1, a gate insulating film 2 and a gate electrode 3 are formed over a first conductive type silicon substrate 1 and a second conductive type extension region 5 is formed after forming a sidewall spacer 4. A second conductive type diffusion layer 7 is formed after forming a sidewall spacer 6. Note that forming the sidewall spacer 4 may be skipped.

A trench portion is formed by etching the source/drain forming regions. A first Si mixed crystal layer 8, a second Si mixed crystal layer 9, and a third Si mixed crystal layer 10 are epitaxially grown in the trench. A Si cap layer may further be formed over the third Si mixed crystal layer 10. A concentration of B in the first Si mixed crystal layer 8 is lower than that of the second Si mixed crystal layer 9, and a B concentration of the third Si mixed crystal layer 10 is lower than that of the second Si mixed crystal layer 9.

As used herein, the term "silicon substrate" refers to a silicon substrate itself, an epitaxially grown layer formed over a silicon substrate, or a well region formed over the silicon substrate. The Si mixed crystal layer is a SiGe layer in which Si is a substantially greatest component when a transistor to be formed is a p-type MOSFET. The Si mixed crystal layer is a SiGeC layer or a SiC layer in which Si is a substantially greatest component when a transistor to be formed is an n-type MOSFET.

Composition ratios of Ge or C in the first Si mixed crystal layer 8, a second Si mixed crystal layer 9, and a third Si mixed crystal layer 10 may be substantially the same or may be different. A composition ratio of Ge or C in the third Si mixed crystal layer 10 may be smaller than the composition ratio of Ge in the second Si mixed crystal layer 10 in order to reduce resistance of a silicide electrode.

Figure 2:
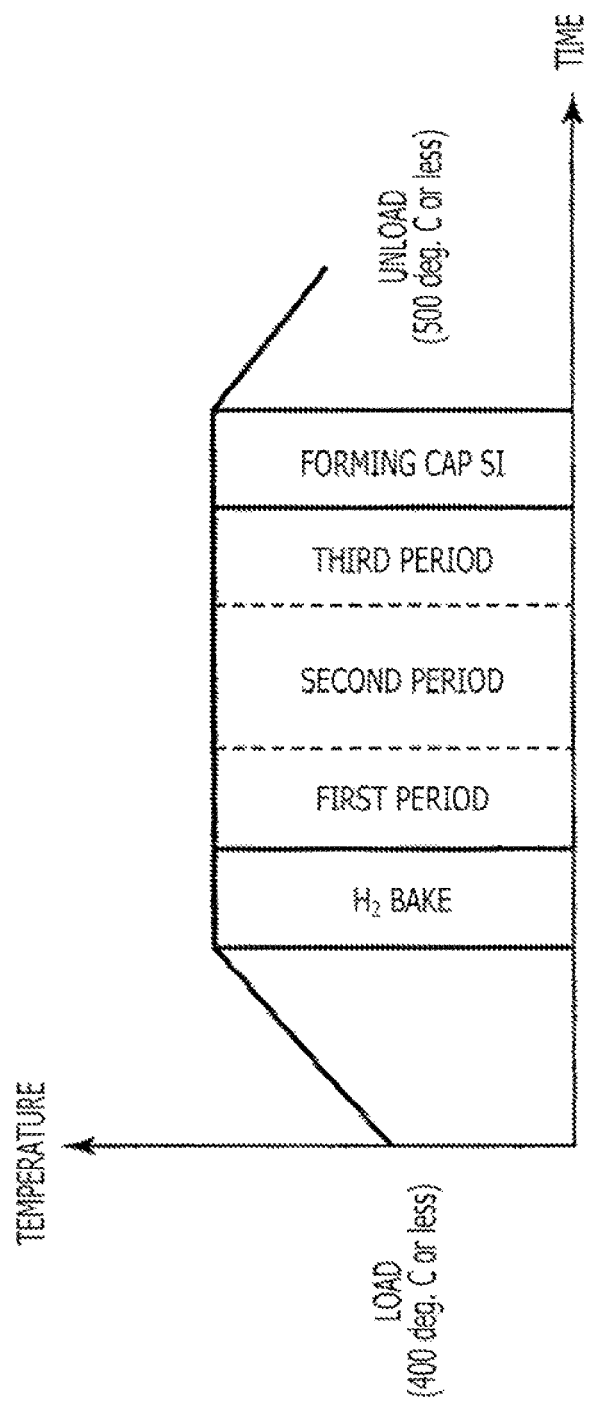
FIG. 2 is a sequence when a Si mixed crystal layer is epitaxially grown.

FIG. 2 is a sequence when a Si mixed crystal layer is epitaxially grown. Here, a p-channel MOSFET will be described. A Si substrate is loaded to a low-pressure chemical vapor phase growth device (LPCVD) in 5 Pa to 1,330 Pa inert gas atmosphere at 400 degrees Celsius or less. As inert gas, $H_2$, $N_2$, Ar, or He may be used.

A pre-bake is applied in $H_2$ or Halogen gas atmosphere of 5 Pa to 13,330 Pa at 400 to 550 deg. C., for example, increases to and maintains at 500 deg. C., for 5 minutes or less, for example, for 3 minutes.

A SiGe layer is grown in at least 3 steps. For example, growth temperature is 400 deg. C. to 550 deg. C. As carrier gas, for example, partial pressure of one of $H_2$, $N_2$, Ar, or He, is assumed to be 5 Pa to 1,330 Pa, partial pressure of $SiH_4$ is assumed to be 1 Pa to 10 Pa, partial pressure of $GeH_4$ is assumed to be 0.1 Pa to 10 Pa, partial pressure of $B_2H_6$ is assumed to be $1\times10^{-4}$ Pa to $1\times10^{-2}$ Pa, and partial pressure of HCl is assumed to be 1 Pa to 10 Pa. The growth time is 1 to 40 minutes.

A Ge composition ratio x in $Si_{1-x}Ge_x$ is assumed to be 0.15 to 0.3.

In a first period, the first Si mixed crystal layer 8 is grown by using partial pressure of $B_2H_6$ as a first partial pressure. In a second period, the second Si mixed crystal layer 9 is grown by using partial pressure of $B_2H_6$ as a second partial pressure that is higher than the first partial pressure. In a third period, the third Si mixed crystal layer 10 is grown by using partial pressure of $B_2H_6$ as a third partial pressure that is lower than the second partial pressure. For example, B concentrations of the first Si mixed crystal layer 8 and the third Si mixed crystal layer 10 are $1\times10^{19}$ cm$^{-3}$ to $1\times10^{20}$ cm$^{-3}$ and a B concentration of the second Si mixed crystal layer 9 is $1\times10^{20}$ cm$^{-3}$ to $2\times10^{20}$ cm$^{-3}$.

The Si cap layer is grown. In this case, the growth temperature is 400 deg. C. to 550 deg. C. As carrier gas, for example, partial pressure of one of $H_2$, $N_2$, Ar, or He, is assumed to be 5 Pa to 1,330 Pa, partial pressure of $SiH_4$ is assumed to be 1 Pa to 10 Pa, partial pressure of $GeH_4$ is assumed to be 0 Pa to 0.4 Pa, partial pressure of $B_2H_6$ is assumed to be $1\times10^{-4}$ Pa to $1\times10^{-2}$ Pa, and partial pressure of HCl is assumed to be 1 Pa to 10 Pa. The growth time is 1 to 10 minutes. Forming the Si cap film may be skipped.

The Si substrate is taken out of the LPCVD after decreasing temperature of the Si substrate to 500 deg. C. or less, for example to 400 deg. C. in an inert gas atmosphere that includes $H_2$, $N_2$, Ar, or He. In the case of an n-channel MOSFET, carbon-containing gas is used instead of $GeH_4$ and as an impurity, Phosphorus (P) or Arsenic (As) is used.

Figure 3A:
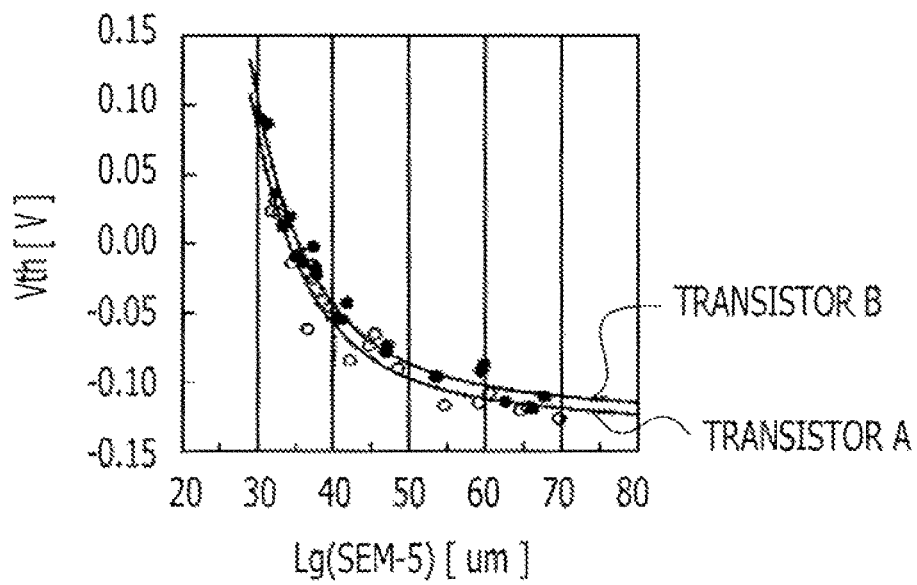
FIGS. 3A to 3C illustrate electric properties of transistors when a thickness of a second B layer is 40 nm.
Figure 3B:
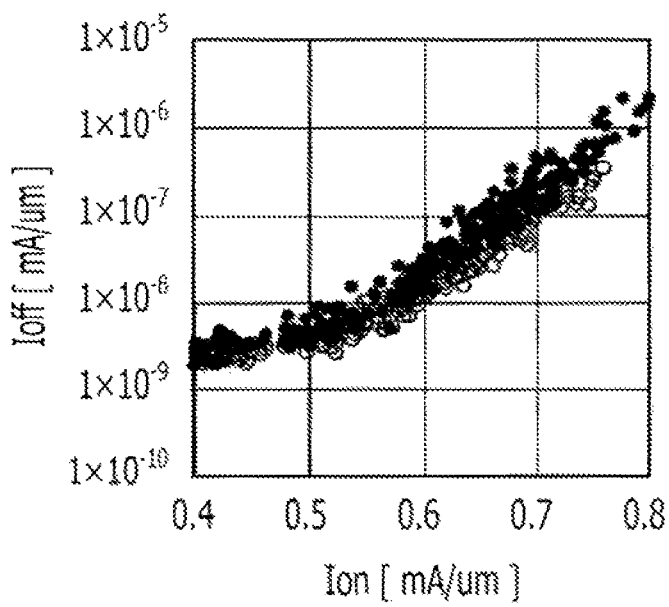
Figure 3C:
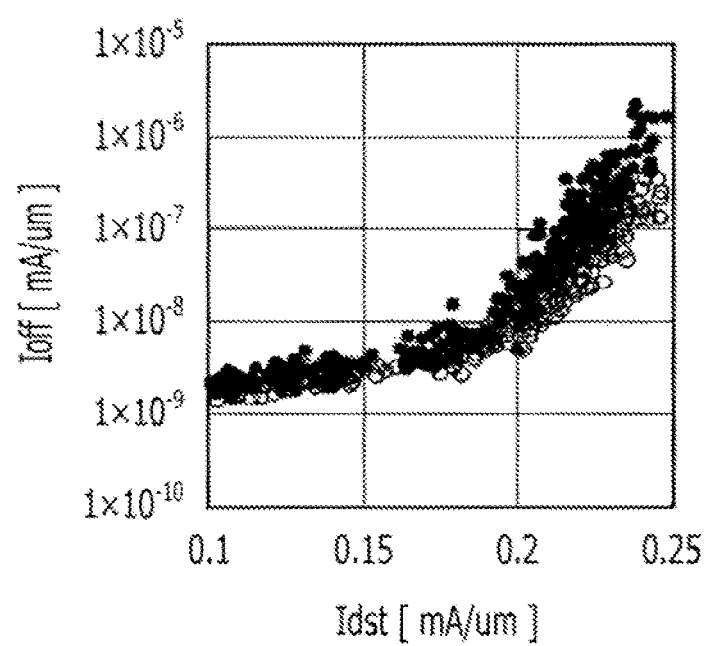

FIGS. 3A to 3C illustrate electric properties of transistors when a thickness of the second Si mixed crystal layer is 40 nm. FIG. 3A illustrates a relationship between a threshold value Vth of the transistors and the channel length Lg. FIG. 3A illustrates measurement results of a transistor A fabricated according to the above described embodiment, and a transistor B fabricated as a comparison example. In the transistor A, B concentrations of the first Si mixed crystal layer 8 and the third Si mixed crystal layer 10 are assumed to be $6.0\times10^{19}$ cm$^{-3}$ and a B concentration of the second Si mixed crystal layer 9 is assumed to be $6.0\times10^{20}$ cm$^{-3}$. The composition ratio of Si and Ge is $Si_{0.8}Ge_{0.2}$. In the transistor B, B concentrations of all of the first Si mixed crystal layer 8, the second Si mixed crystal layer 9, and the third Si mixed crystal layer 10 are substantially the same. The composition ratio of Si and Ge is $Si_{0.8}Ge_{0.2}$. The threshold values Vth of the transistor A are substantially the same values as those of the transistor B, and no short channel effect was observed.

FIG. 3B is a graph illustrating a relationship between an on-current and an off-current. In FIG. 3B, white dots indicate measurement values of the transistor A, while black dots indicate measurement values of the transistor B. As illustrated in FIG. 3B, the on-current of the transistor A in a saturated region improved approximately 4% compared with the on-current of the transistor B. FIG. 3C is a graph illustrating a relationship between a source-drain current and an off-current. In FIG. 3C, white dots indicate measurement values of the transistor A, while black dots indicate measurement values of the transistor B. In FIG. 3C, the source-drain current of the transistor A in a linear region improved approximately 3% compared with the source-drain current of the transistor B.

Figure 4A:
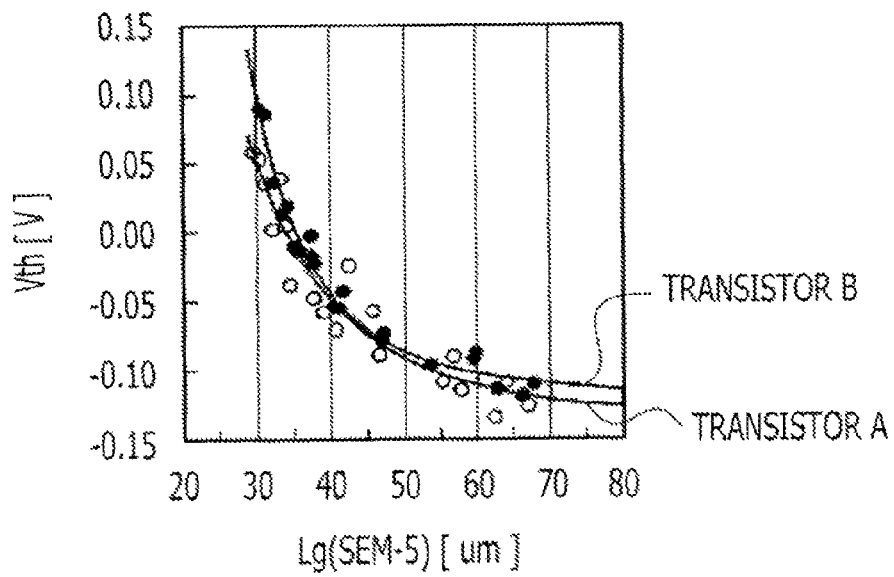
FIGS. 4A to 4C illustrate electric properties of the transistors when a thickness of the second B layer is 20 nm.
Figure 4B:
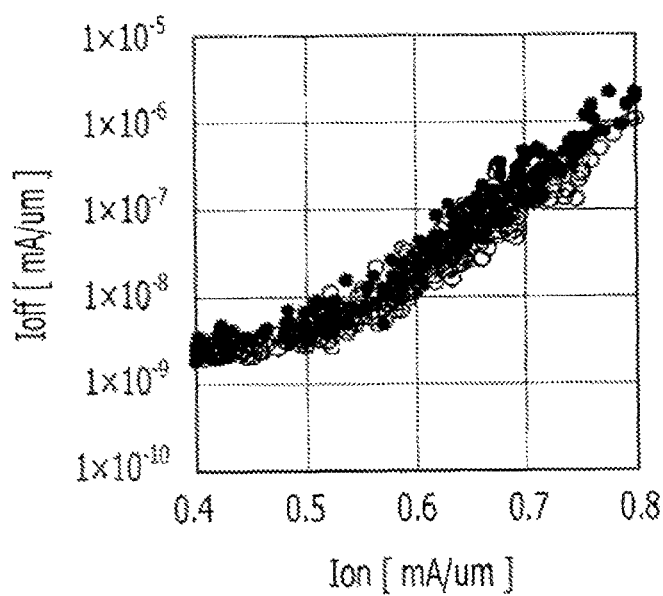
Figure 4C:
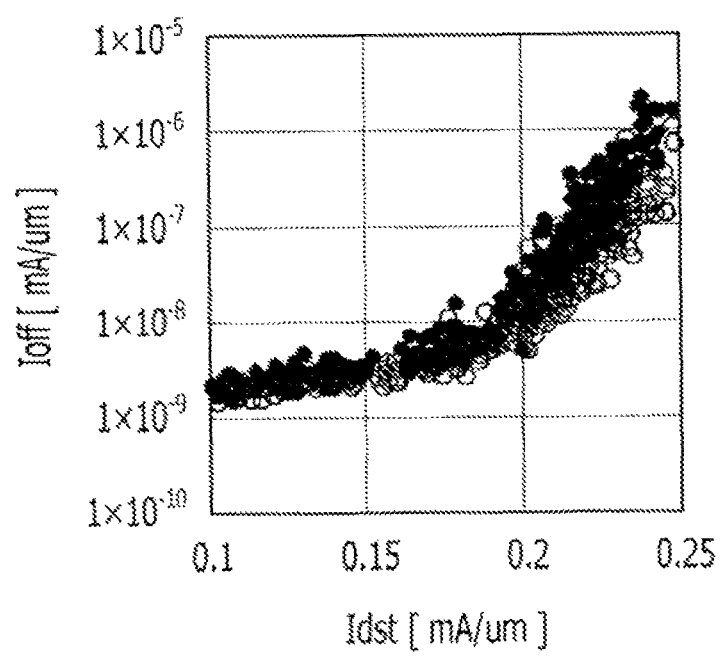

FIGS. 4A to 4C illustrate electric properties of the transistors when a thickness of the second Si mixed crystal layer is 20 nm. FIG. 4A illustrates a relationship between a threshold value Vth and a channel length Lg of the transistors. In FIG. 4A, the threshold values Vth of the transistor A indicate substantially the same values as those of the transistor B and no short-channel effect was observed. FIG. 4B is a graph illustrating a relationship between an on-current and an off-current of the transistors. In FIG. 4B, white dots indicate measurement values of the transistor A, while black dots indicate measurement values of the transistor B. As illustrated in FIG. 4B, the on-current of the transistor A in a saturated region improved approximately 2% compared with the on-current of the transistor B. FIG. 4C is a graph illustrating a relationship between a source-drain current and an off current of the transistors. In FIG. 4C, white dots indicate measurement values of the transistor A, while black dots indicate measurement values of the transistor B. In FIG. 4C, the source-drain current of the transistor A in a linear region improved approximately 2% compared with the source-drain current of the transistor B.

Figure 5A:
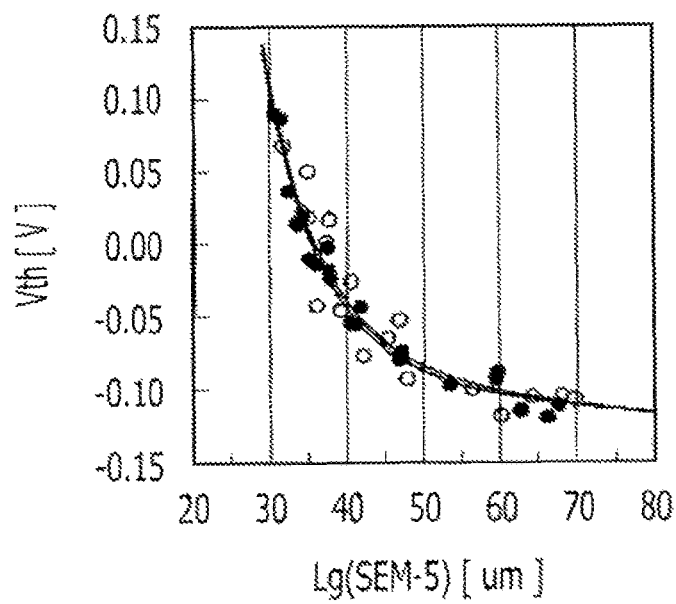
FIGS. 5A to 5C illustrate electric properties of the transistors when a thickness of the second B layer is 60 nm.
Figure 5B:
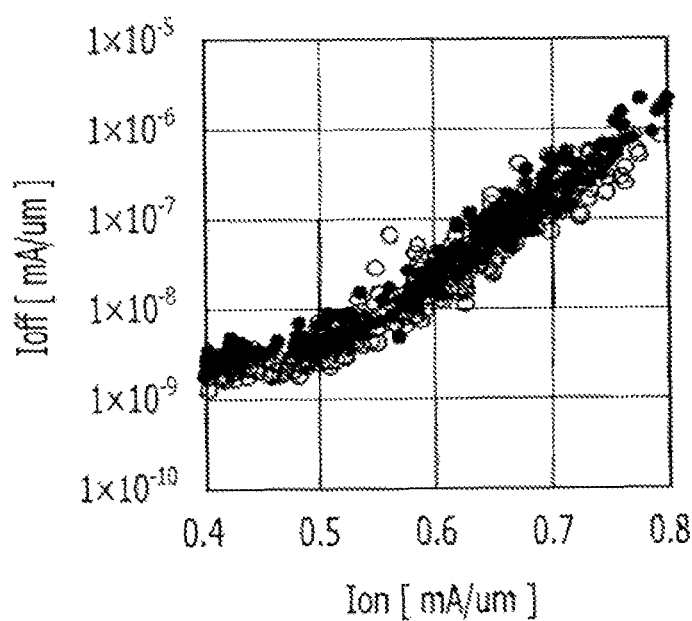
Figure 5C:
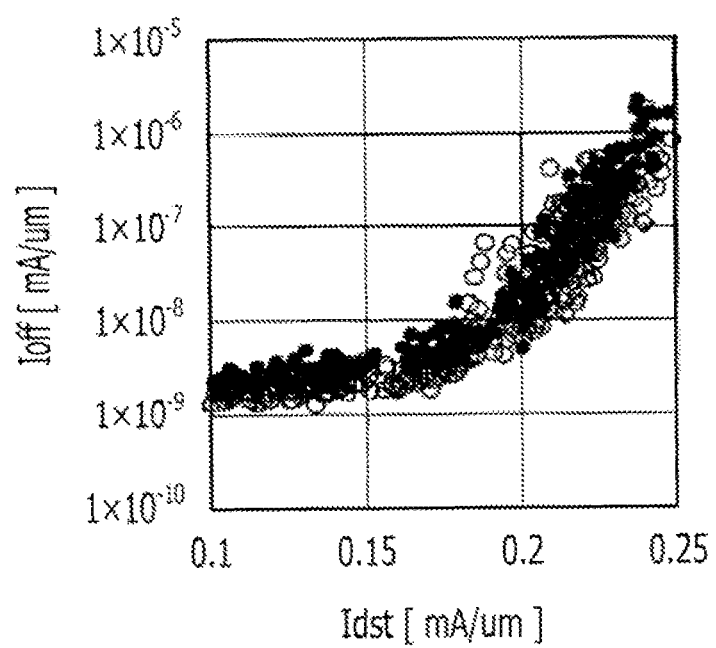

FIGS. 5A to 5C illustrate electric properties of the transistors when a thickness of the second Si mixed crystal layer is 60 nm. FIG. 5A illustrates a relationship between a threshold value Vth and a channel length Lg of the transistors. In FIG. 5A, the threshold values Vth of the transistor A indicate substantially the same values as those of the transistor B and no short-channel effect was observed.

FIG. 5B illustrates a relationship between the on-current and the off current of the transistors. In FIG. 5B, white dots indicate measurement values of the transistor A, while black dots indicate measurement values of the transistor B. As illustrated in FIG. 5B, on-currents of the transistor A in a saturated region indicates substantially the same values as the on-currents of the transistor B. FIG. 5C is a graph illustrating a relationship between a source-drain current and a off-current of the transistors. In FIG. 5C, white dots indicate measurement values of the transistor A, while black dots indicate measurement values of the transistor B. In FIG. 5C, the source-drain currents of the transistor A in a linear region improved slightly compared with the source-drain currents of the transistor B, however, the variation is increased.

Figure 6:
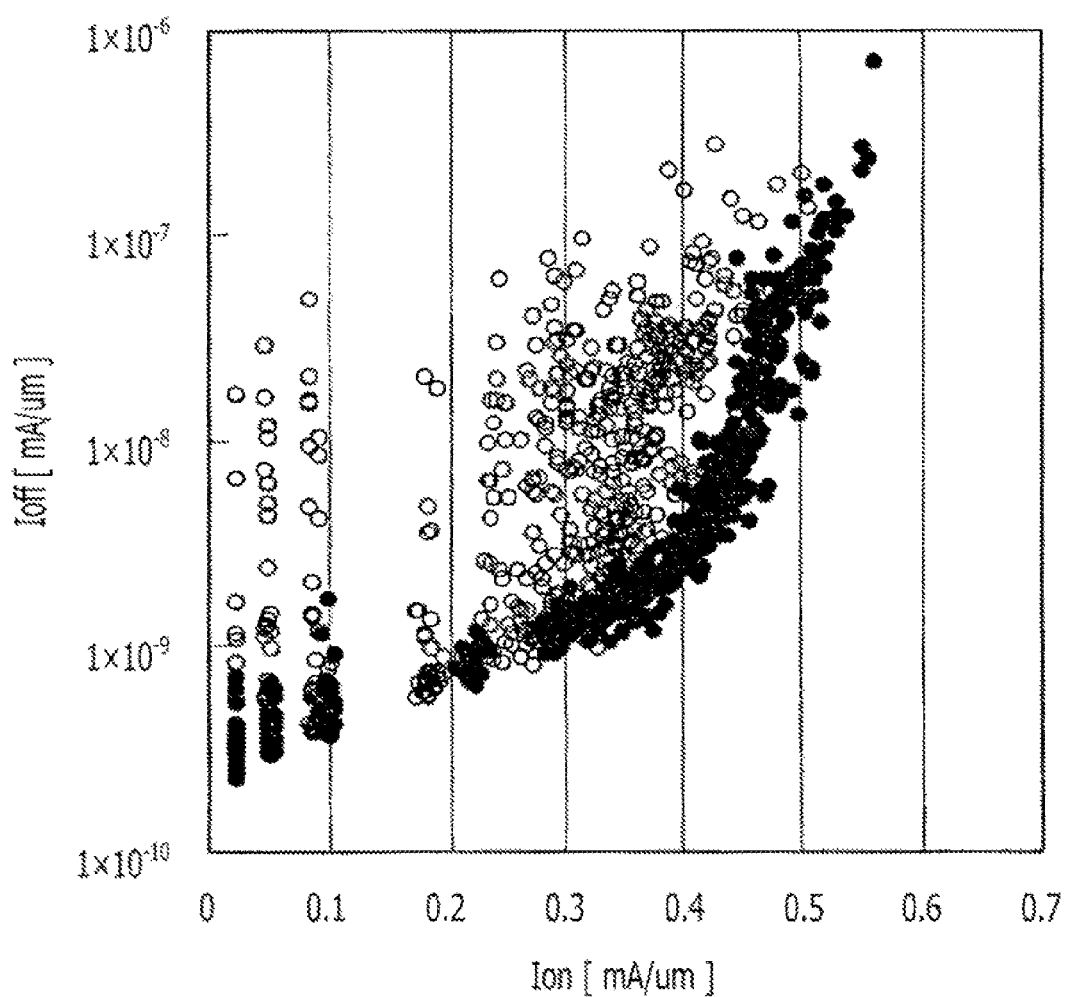
FIG. 6 illustrates electric properties of transistors fabricated as comparison examples.

FIG. 6 illustrates electric properties of a transistor C in which B concentrations of all of a first Si mixed crystal layer, a second Si mixed crystal layer, and a third Si mixed crystal layer are $6.0\times10^{20}$ cm$^{-3}$. In FIG. 6, the white dots indicate measurement values of the transistor C, while the black dots indicate measurement values of the transistor B. In FIG. 6, variation of the off-current values of the transistor C increased. As described above, the buried SiGe layer is desirably a stack structure of a low B concentration SiGe layer/a high B concentration SiGe layer/a low B concentration SiGe layer. It is revealed that a thickness of the intermediate high B concentration SiGe layer is preferably in a range of 20 nm to 60 nm.

Figure 7:
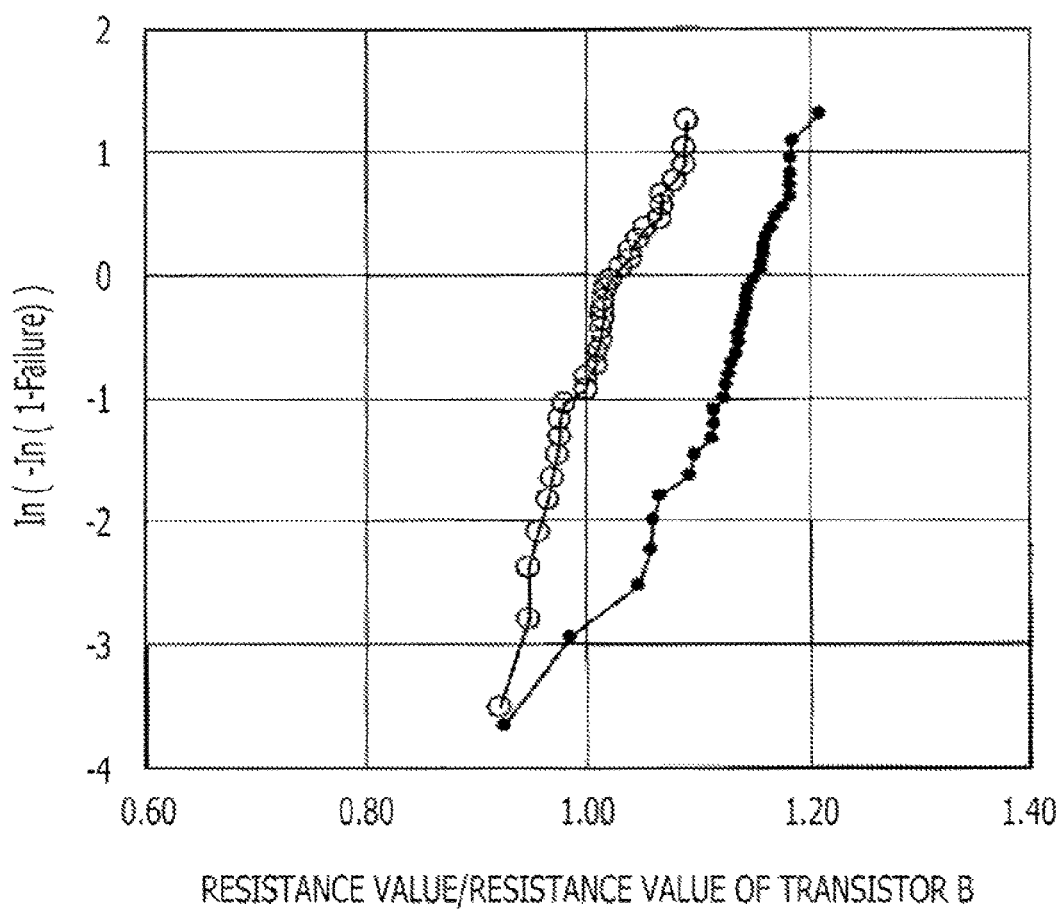
FIG. 7 illustrates a relationship between electric resistance of a gate electrode that includes silicide and a B concentration.

FIG. 7 compares resistance values of silicide gate electrodes of a device with a three-layer structure of Si mixed crystal layers and a device with a single layer structure of a Si mixed crystal layer. The horizontal axis indicates cumulative frequencies (Weibull plot) while the vertical axis indicates the number of chips in logarithm. When the three layer structure is employed, an increase in resistance and the variation are small. On the other hand, when a single layer structure of a high B concentration layer is employed, an increase in the resistance and the variation are larger compared with a standard concentration. Here, a B concentration at an interface of Si/SiGe over the gate electrode is assumed to be a standard concentration for comparison.

Figure 8A:
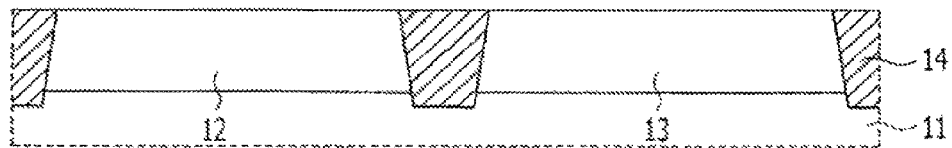
FIGS. 8A to 8AG are sectional views illustrating manufacturing processes according to an embodiment.

An embodiment will be described by referring to FIGS. 8A to 8AG. As illustrated in FIG. 8A, an p-type well region 12 is formed by ion implanting B to a p-type silicon substrate 11 and a n-type well region 13 is formed by ion implanting As to the p-type silicon substrate 11. After forming a trench that isolates the p-type well region 12 and the n-type well region 13, an insulating film such as SiO2 is buried in the trench to form an element isolation insulating film 14 with a Shallow Trench Isolation (STI) structure.

Figure 8B:
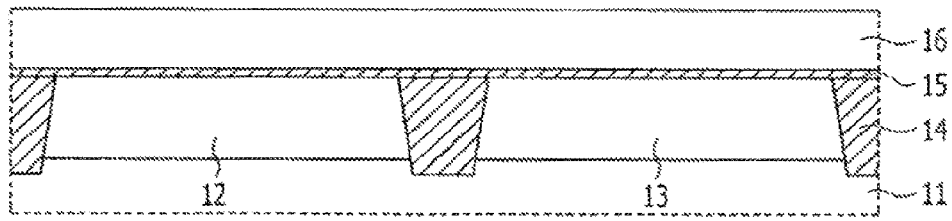
Figure 8C:
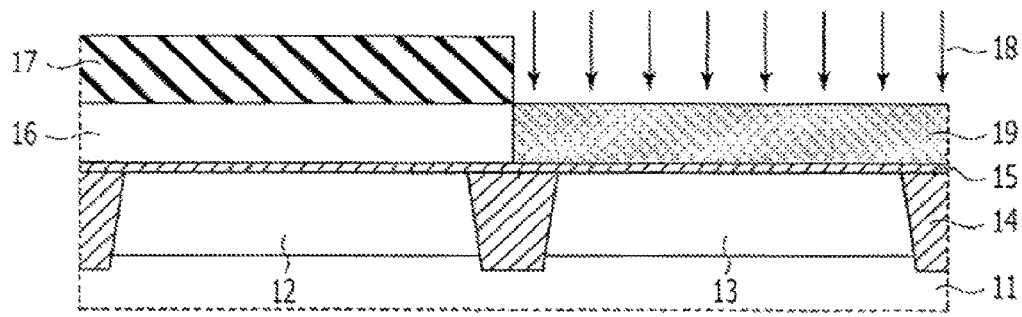

As illustrated in FIG. 8B, a gate insulating film 15 is formed over the element isolation insulating film 14 and the well regions 12 and 13. After forming the gate insulating film 15, a polycrystalline silicon film 16 is formed thereover. As illustrated in FIG. 8C, under a state that the p-type well region 12 is covered with the resist pattern 17, a p-type polycrystalline silicon film 19 is formed by implanting B ion 18 to the polycrystalline silicon film 16 at acceleration energy of 3 keV to 5 keV with a dose quantity of $2 \times 10^{15}$ cm$^{-2}$ to $6 \times 10^{15}$ cm$^{-2}$. In addition to implantation of B, in order to reduce, if not prevent B from penetrating the polycrystalline silicon film 16, Ge is implanted to the polycrystalline silicon film 16 at acceleration energy of 10 keV to 20 keV with a dose quantity of $1 \times 10^{14}$ cm$^{-2}$ to $1 \times 10^{15}$ cm$^{-2}$.

Under the state that polycrystalline silicon film 16 over the p-type well region 12 is covered with the resist pattern, an n-type polycrystalline silicon film 20 is formed by implanting As ion 18 to the polycrystalline silicon film 16 at acceleration energy of 20 keV to 30 keV with a dose quantity of $3 \times 10^{15}$ cm$^{-2}$ to $8 \times 10^{15}$ cm$^{-2}$.

Figure 8D:
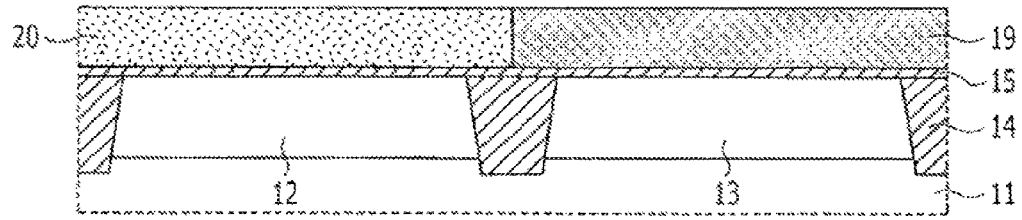

As illustrated in FIG. 8D, annealing treatment is applied to activate the implanted B and As. For example, lamp annealing is applied at 950 deg C. to 1000 deg C. for 1 second to 5 seconds. The processes are performed before patterning the polycrystalline silicon film 16 in order to suppress depletion of the gate electrode.

Figure 8E:
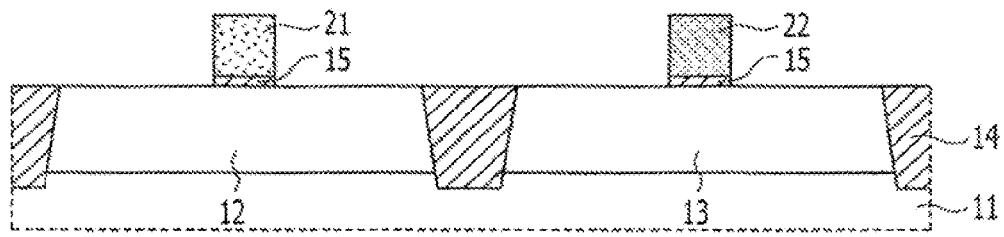
Figure 8F:
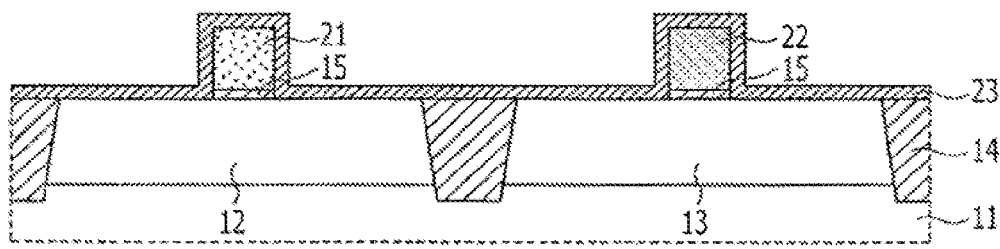
Figure 8G:
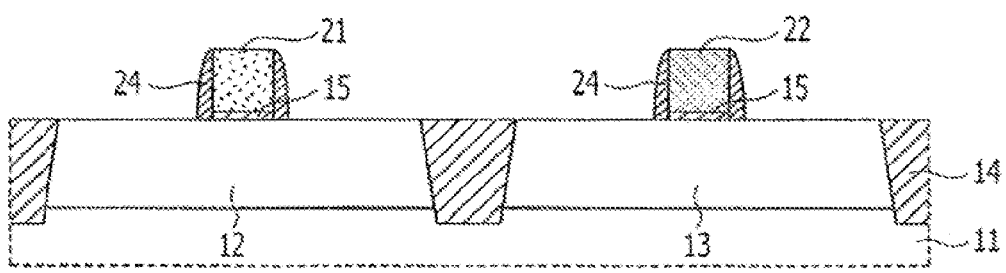

As illustrated in FIG. 8E, an n-type gate electrode 21 and a p-type gate electrode 22 are formed by photolithography and etching processes. As illustrated in FIG. 8F, a SiN film 23 with a thickness of 5 nm to 12 nm is deposited by CVD at the substrate temperature of 500 deg C. to 800 deg C. As illustrated in FIG. 8G, a first sidewall spacer 24 is formed at a sidewall of the n-type gate electrode 21 and the p-type gate electrode 22 by applying an anisotropic etching to the SiN film 23.

Figure 8H:
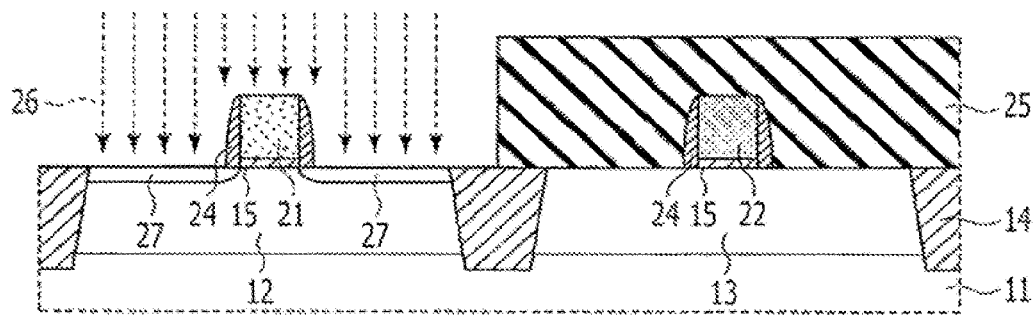

As illustrated in FIG. 8H, after forming a resist pattern 25 so as to cover the n-type well region 13, an n-type extension region 27 is formed by implanting As ion 26 to the p-type well region 12 using the n-type gate electrode 21 and the first sidewall spacer 24 as a mask. In this case, conditions for ion implantation are, for example, acceleration energy of 0.5 keV to 2 keV with a dose quantity of $1 \times 10^{15}$ cm$^{-2}$ to $3 \times 10^{15}$ cm$^{-2}$. A region sandwiched between two extension regions 27 becomes a channel region.

In order to suppress short-channel, In or B may be implanted to the p-type well region 12. In this case, conditions for ion implantation of In are, for example, acceleration energy of 50 keV to 80 keV with a dose quantity of $1.5 \times 10^{13}$ cm$^{-2}$ to $3 \times 10^{13}$ cm$^{-2}$, and conditions for ion implantation of B, are for example, acceleration energy of 6 keV to 10 keV with a dose quantity of $2.5 \times 10^{13}$ cm$^{-2}$ to $4 \times 10^{13}$ cm$^{-2}$. When B is used, in order to suppress a channeling tail of B, B may be implanted at acceleration energy of 10 keV to 20 keV with a dose quantity of $1.5 \times 10^{13}$ cm$^{-2}$ to $3 \times 10^{13}$ cm$^{-2}$.

Ions may be implanted by dividing the dose quantity while changing a direction of the substrate. Moreover, impurities may be implanted with 10 degree to 30 degree inclined with respect to the normal line direction of a surface of the silicon substrate. The reason why the impurities are implanted from the inclined direction is to form an impurity region under a channel with a reverse polarity of that of the source/drain to suppress short-channel effect.

Figure 8I:
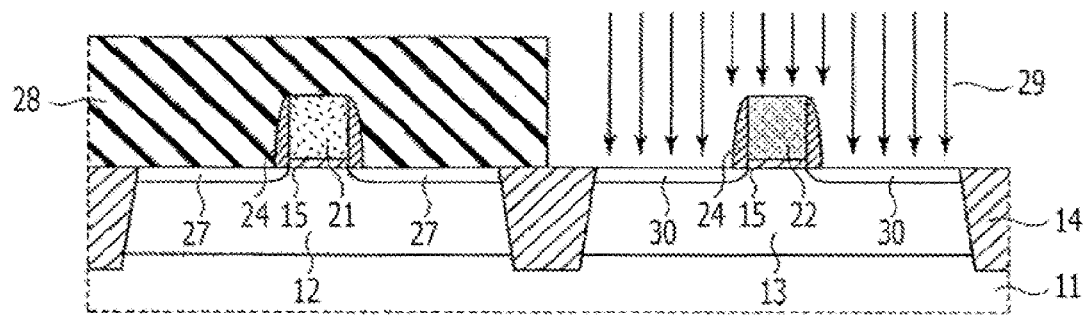

As illustrated in FIG. 8I, after forming a resist pattern 28 so as to cover the p-type well region 12, a p-type extension region 30 is formed by implanting B ion 29 to the n-type well region 13 using the p-type gate electrode 22 and the first sidewall spacer 24 as a mask. In this case, conditions for ion implantation are for example, acceleration energy of 0.1 keV to 1 keV with a dose quantity of $1 \times 10^{15}$ cm$^{-2}$ to $3 \times 10^{15}$ cm$^{-2}$. A region sandwiched between the two extension regions 30 becomes a channel region.

In order to suppress a short-channel effect, Sb or As may be implanted to the n-type well region 13. In this case, conditions for ion implantation of Sb are for example, acceleration energy of 40 keV to 70 keV with a dose quantity of $2 \times 10^{13}$ cm$^{-2}$ to $4 \times 10^{13}$ cm$^{-2}$, and conditions for ion implantation of the As are acceleration energy of 40 keV to 70 keV with a dose quantity of $2 \times 10^{13}$ cm$^{-2}$ to $4 \times 10^{13}$ cm$^{-2}$. The ions may be implanted by dividing the dose quantity while changing a direction of the substrate.

Figure 8J:
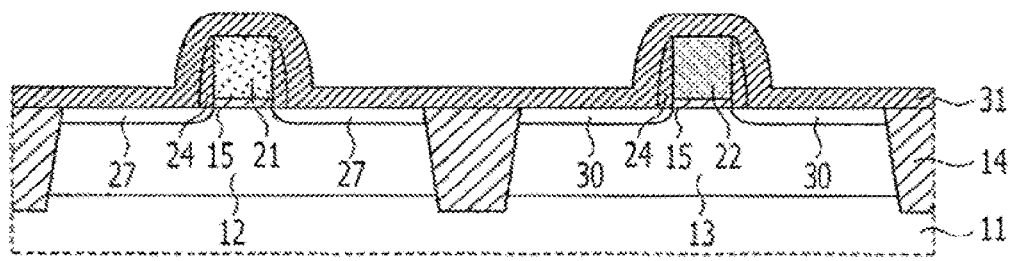
Figure 8K:
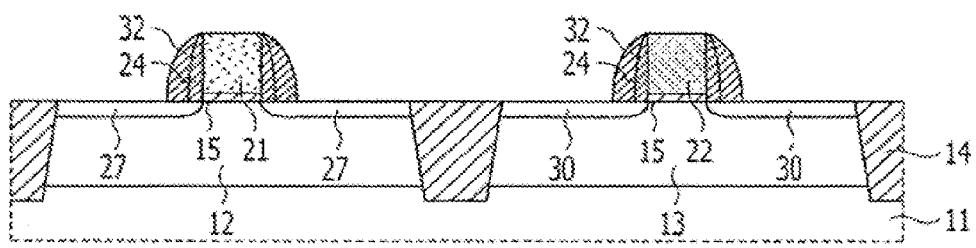

As illustrated in FIG. 8J, a SiN film 31 with a thickness of 20 nm to 50 nm is deposited by CVD at the substrate temperature of 400 deg C. to 600 deg C. As illustrated in FIG. 8K, a second sidewall spacer 32 is formed at a sidewall of the n-type gate electrode 21 and the p-type gate electrode 22 by applying an anisotropic etching to the SiN film 31.

Figure 8L:
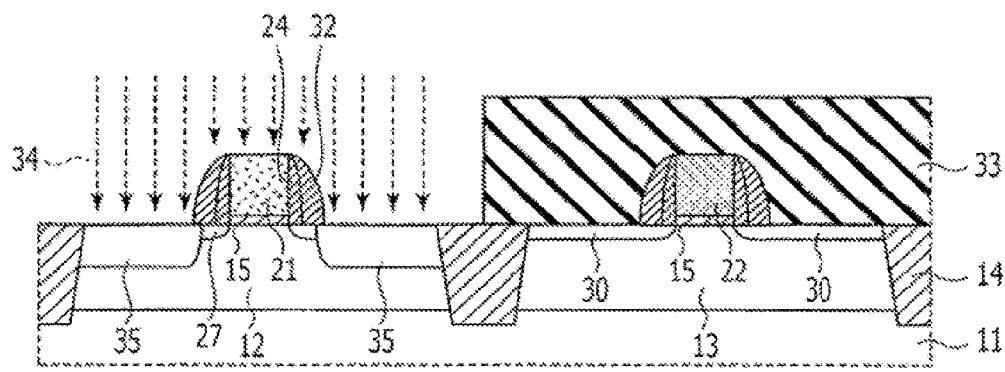

As illustrated in FIG. 8L, after forming a resist pattern 33 so as to cover the n-type well region 13, an n-type diffusion region 35 that is a source/drain region is formed by implanting As ion 34 to the p-type well region 12 using the n-type gate electrode 21 and the second sidewall spacer 32 as a mask. In this case, conditions for ion implantation are for example, acceleration energy of 5 keV to 15 keV with a dose quantity of $1 \times 10^{15}$ cm$^{-2}$ to $3 \times 10^{15}$ cm$^{-2}$.

Figure 8M:
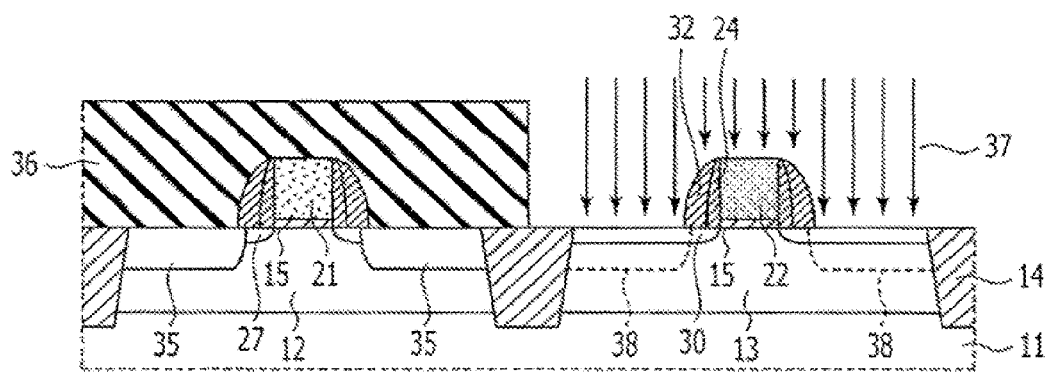

As illustrated in FIG. 8M, after forming a resist pattern 36 so as to cover the p-type well region 12, a p-type diffusion region 38 that is a source/drain region is formed by implanting B ion 37 to the n-type well region 13 using the p-type gate electrode 22 and the second sidewall spacer 32 as a mask. In this case, conditions for ion implantation are, for example, acceleration energy of 0.1 keV to 1 keV with a dose quantity of $1 \times 10^{13}$ cm$^{-2}$ to $\times 10^{14}$ cm$^{-2}$.

Figure 8N:
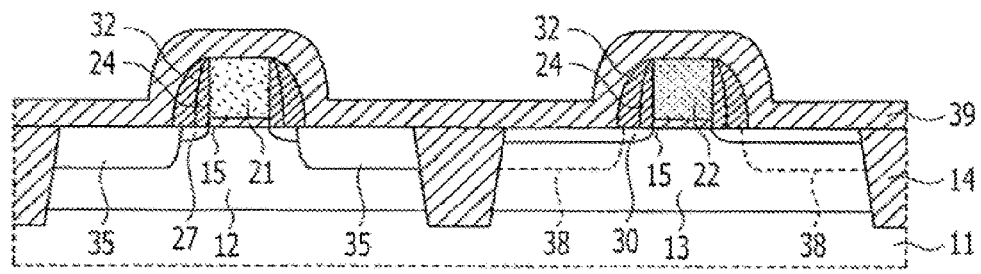

As illustrated in FIG. 8N, a SiO2 film of, for example, 10 nm to 40 nm is formed by a low temperature CVD device, or a high density plasma CVD (HDP) device at the substrate temperature of 400 deg. C. to 600 deg. C.

Figure 8O:
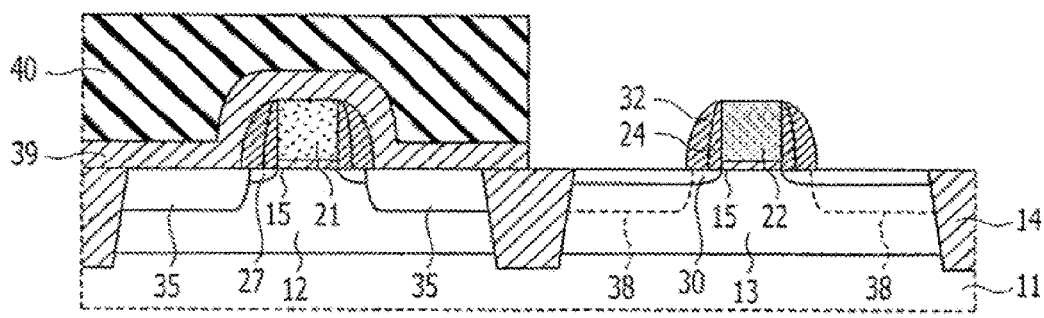

As illustrated in FIG. 8O, after forming a resist pattern 40 so as to cover the p-type well region 12, the SiO2 film 39 over the n-type well region 13 is removed by dry-etching using the resist pattern 40 as a mask.

Figure 8P:
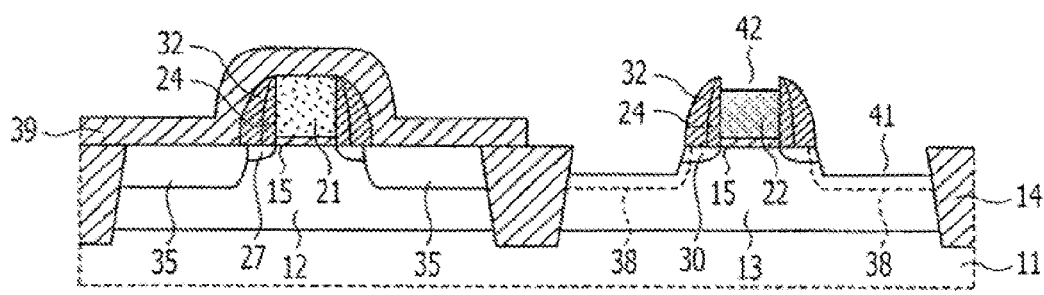

As illustrated in FIG. 8P, after removing the resist pattern 40, a recessed portion 41 with a depth of 20 nm to 60 nm, is formed by dry-etching the Si substrate 11 using the remaining $SiO_2$ film 39 as an etching mask. At approximately the same time, the surface of the p-type gate electrode 22 is etched to form a gate recessed portion 42.

Figure 8Q:
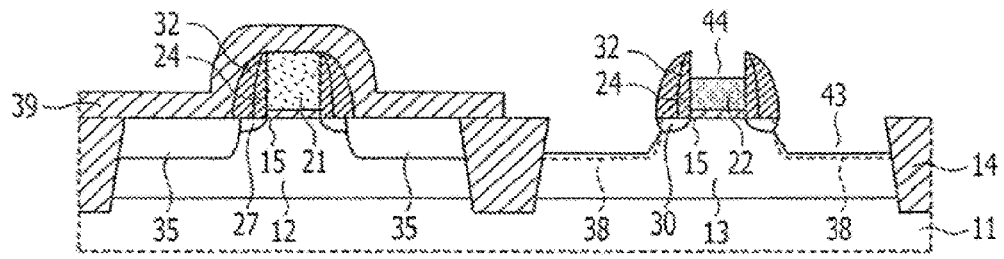

As illustrated in FIG. 8Q, a recessed portion 43 and a gate recessed portion 44 are formed by a wet etching. The gate recessed portion 44 has a depth from the substrate of approximately 40 nm to 80 nm. In this case, the Si substrate 11 is isotropically-etched by using, for example, $NH_3OH$, KOH, or TMAH solution as an etchant, thereby reducing intervals between the recessed portions 43 formed at both sides of the p-type gate electrode 22.

Figure 8R:
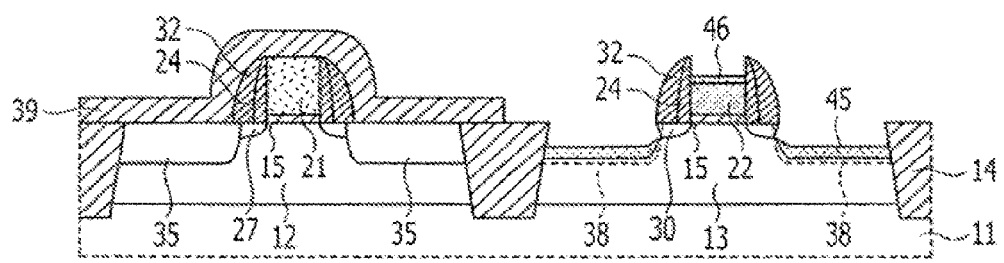

As illustrated in FIG. 8R, a p-type SiGe layer 45 is grown. For example, the growth temperature is 400 deg. C. to 550 deg. C. As carrier gas, for example, partial pressure of one of $H_2$, $N_2$, Ar, or He, is assumed to be 5 Pa to 1,330 Pa, partial pressure of $SiH_4$ is assumed to be 1 Pa to 10 Pa, partial pressure of $SiH_4$ is assumed to be 1 Pa to 10 Pa, partial pressure of GeH4 is assumed to be 0.1 Pa to 10 Pa, partial pressure of $B_2H_6$ is assumed to be $1\times10^{-4}$ Pa to $1\times10^{-}$Pa, and partial pressure of HCl is assumed to be 1 Pa to 10 Pa. A p-type SiGe layer 45 with a B concentration of $1\times10^{19}$ cm$^{-3}$ to $1\times10^{20}$ cm$^{-3}$ is epitaxially grown over a surface of the recessed portion 43. The growth time is 1 to 40 minutes. A Ge composition ratio x in $Si_{1-x}Ge_x$ is assumed to be 0.15 to 0.3. At approximately the same time, a p-type SiGe layer 46 is also grown over a surface of the gate recess portion 44 of the p-type gate electrode 22.

Figure 8S:
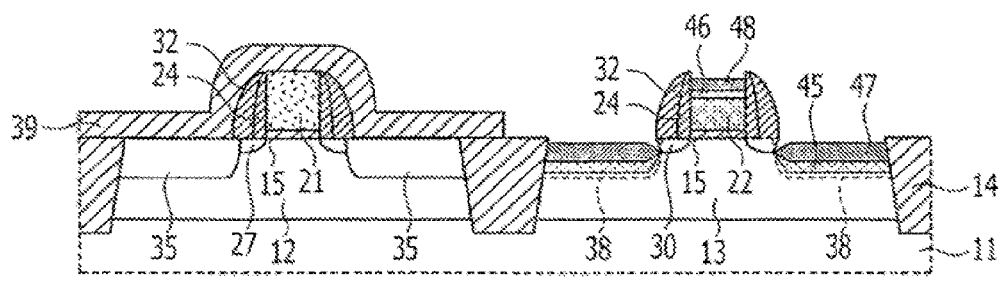

As illustrated in FIG. 8S, a p+-type SiGe layer 47 with a B concentration of $1\times10^{20}$ cm$^{-3}$ to $2\times10^{20}$ cm$^{-3}$ is epitaxially grown over the SiGe layer 45. At approximately the same time, a p+-type SiGe layer 48 is also grown over the p-type SiGe layer 46 over the p-type gate electrode 22. The B concentration of the SiGe layer 47 is set to be higher than the B concentration of the SiGe layer 45.

Figure 8T:
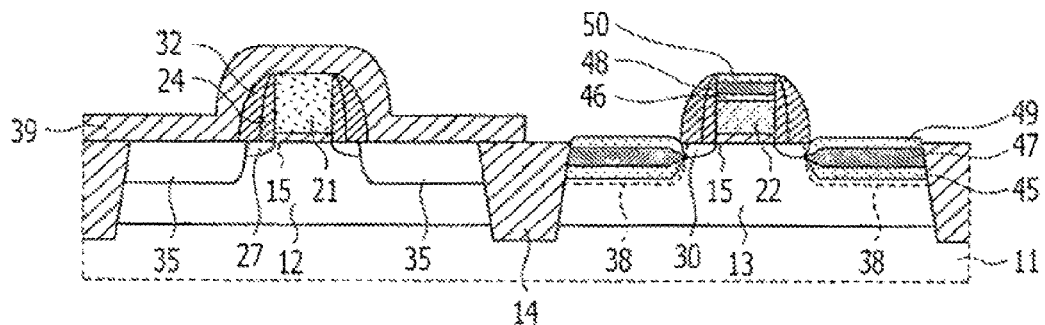

As illustrated in FIG. 8T, a p-type SiGe layer 49 with a B concentration of $1\times10^{19}$ cm$^{-3}$ to $1\times10^{20}$ cm$^{-3}$ is epitaxially grown over the p+-type SiGe layer 47. At approximately the same time, a p+-type SiGe layer 50 is also formed over the p+-type SiGe layer 48 over the p+-type gate electrode 22. The B concentration of the SiGe layer 49 is set to be lower than that of the SiGe layer 47.

A thickness of each of the SiGe layer 45, the SiGe layer 47, and the SiGe layer 49 depends on a depth of the recessed portion 43. The thickness of the p+-type SiGe layer 47 is desirably 20 nm or more because resistance contribution of a shallow junction implantation is about 20 nm. The thickness of the p+-type SiGe layer 45 is desirably about 20 nm. The thickness of the p-type SiGe layer 49 that becomes a silicide forming layer and silicide is formed over the surface is desirably 10 nm or more.

As described above, the combined film thickness of the SiGe layers is desirably at least 50 nm. Moreover, the film thickness of the p+-type SiGe layer is desirably 20 nm to 60 nm in view of the electric properties illustrated in FIGS. 3A, 3B, 3C, 4A, 4B, 4C, 5A, 5B, and 5C.

Figure 8U:
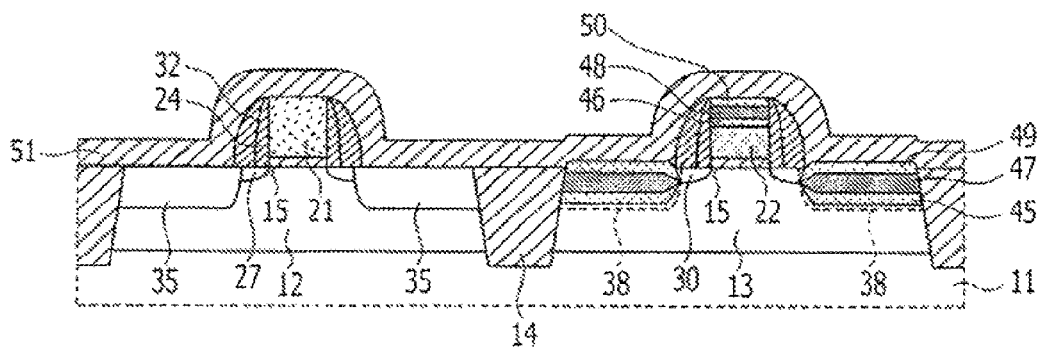

As illustrated in FIG. 8U, after removing the $SiO_2$ film 39, a $SiO_2$ film 51 for example, with a thickness of 10 nm to 40 nm is formed as an insulating film by using a low temperature CVD device, or a high density plasma CVD (HDP) device at the substrate temperature of 400 deg. C. to 550 deg. C.

Figure 8V:
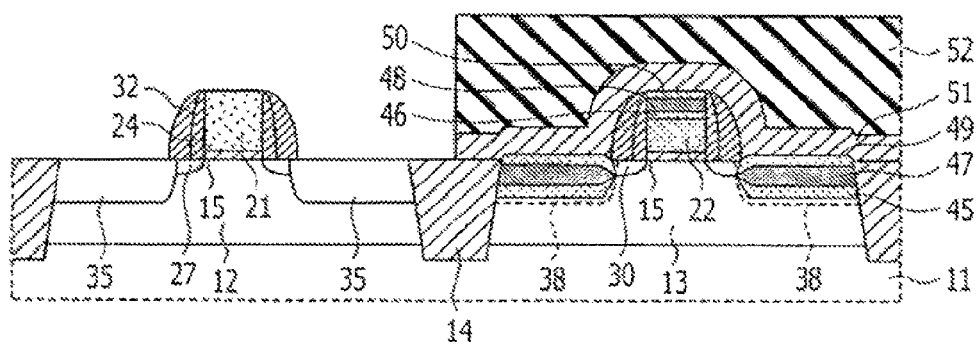

As illustrated in FIG. 8V, after forming a resist pattern 52 so as to cover the n-type well region 13, the $SiO_2$ film 51 of the p-type well region 12 side is removed by dry-etching using the resist pattern 52 as a mask.

Figure 8W:
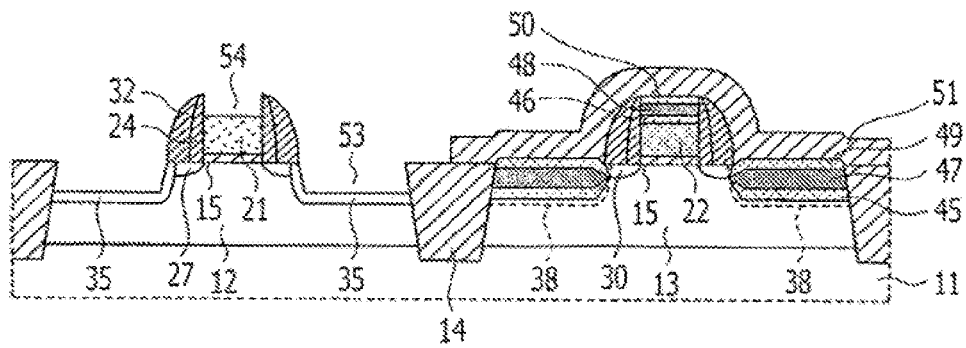

As illustrated in FIG. 8W, after removing the resist pattern 52, a recessed portion 53 is formed by dry-etching the p-type silicon substrate 11 using the remaining $SiO_2$ film 51 as an etching mask. At approximately the same time, the surface of the n-type gate electrode 21 is etched and a gate recessed portion 54 is formed.

A depth of the recessed portion is 10 nm to 40 nm. Forming the recessed portion may be performed generally by the dry-etching process, or a recessed portion of 20 nm to 40 nm may be formed by isotropic etching using, for example, $NH_3OH$, KOH, or TMAH solution after etching 10 nm to 30 nm by dry-etching.

Figure 8X:
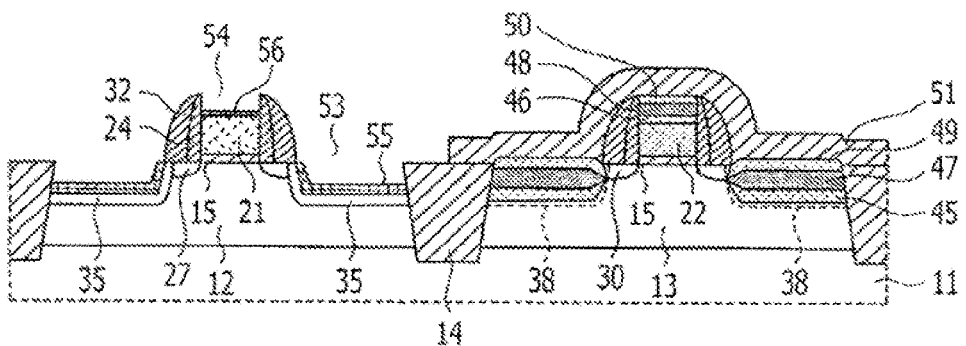

As illustrated in FIG. 8X, an n-type SiC layer 55 with a P concentration of $1.0\times10^{18}$ cm$^{-3}$ to $5.0\times10^{19}$ cm$^{-3}$ is epitaxially grown over a surface of the recessed portion 53. At approximately the same time, an n-type SiC layer 56 is grown over a surface of a gate recessed portion 54 of the n-type gate electrode 21.

Figure 8Y:
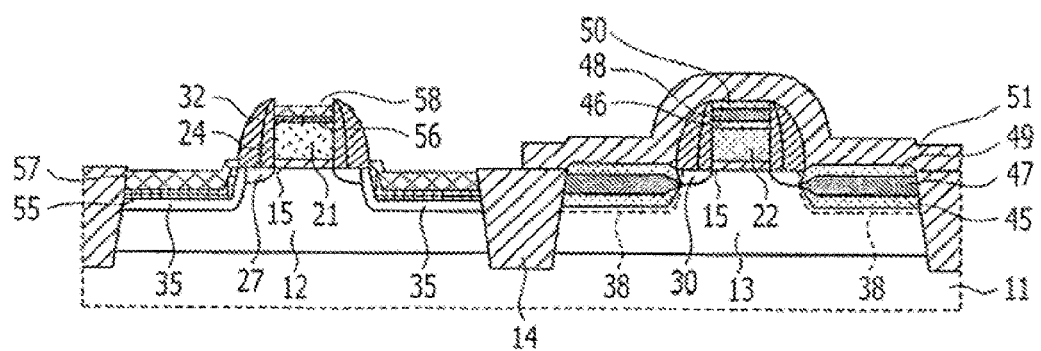

As illustrated in FIG. 8Y, an n+ type SiC layer 57 with a P concentration of $5.0\times10^{19}$ cm$^{-3}$ to $5.0\times10^{21}$ cm$^{-3}$ is epitaxially grown over the SiC layer 55. At approximately the same time, an n+ type SiC layer 58 is also formed over the n-type SiC layer 56 over the n-type gate electrode 21.

Figure 8Z:
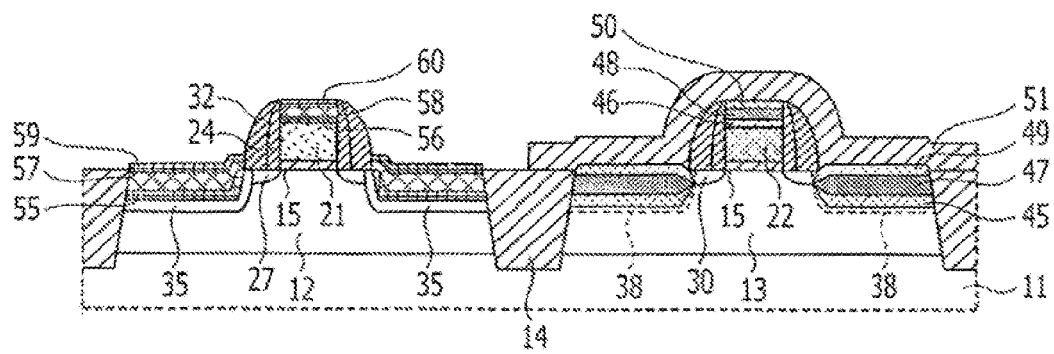
Figure 8A:
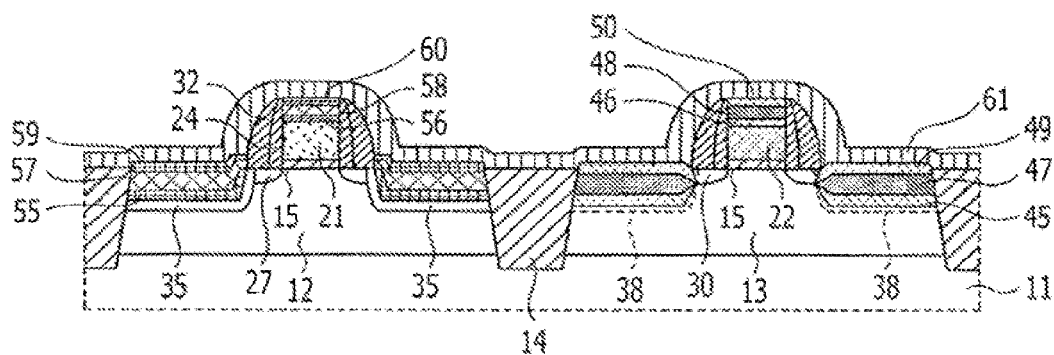
Figure 8A:
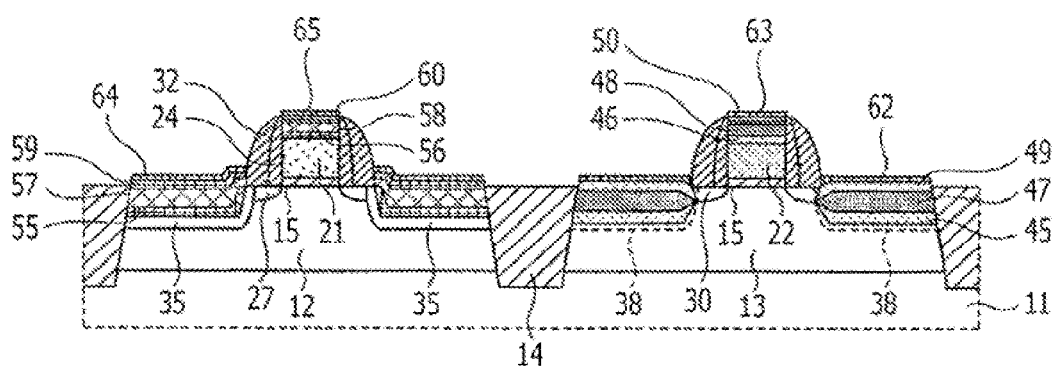
Figure 8A:
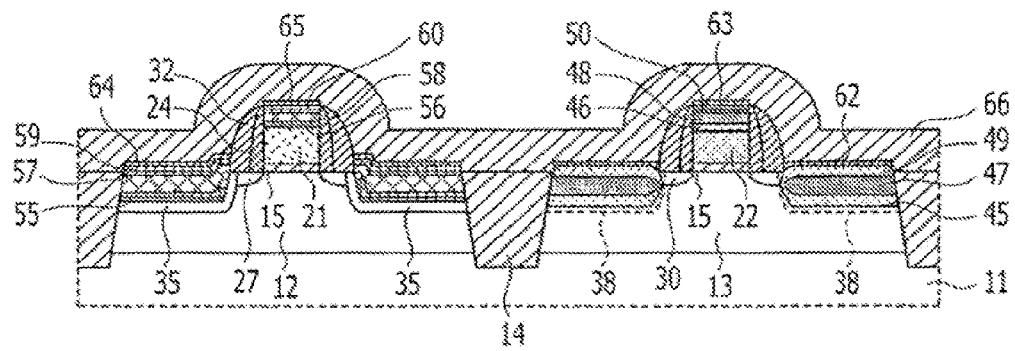
Figure 8A:
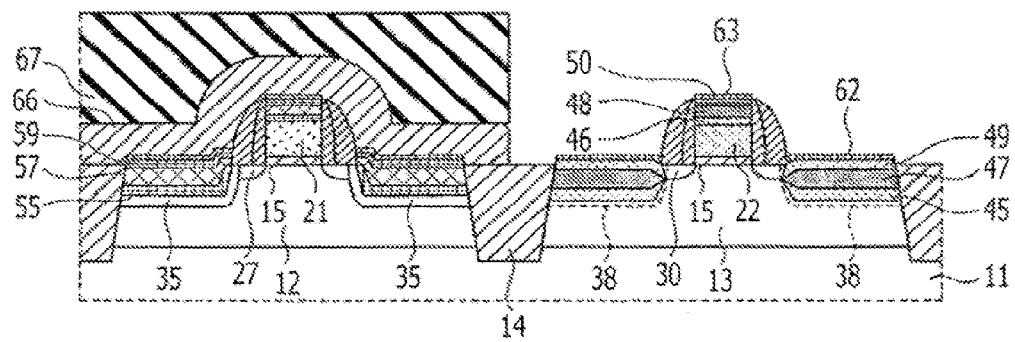
Figure 8A:
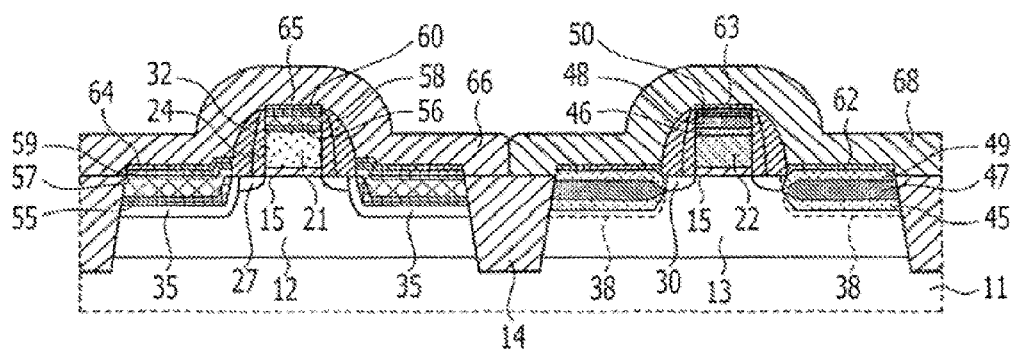
Figure 8A:
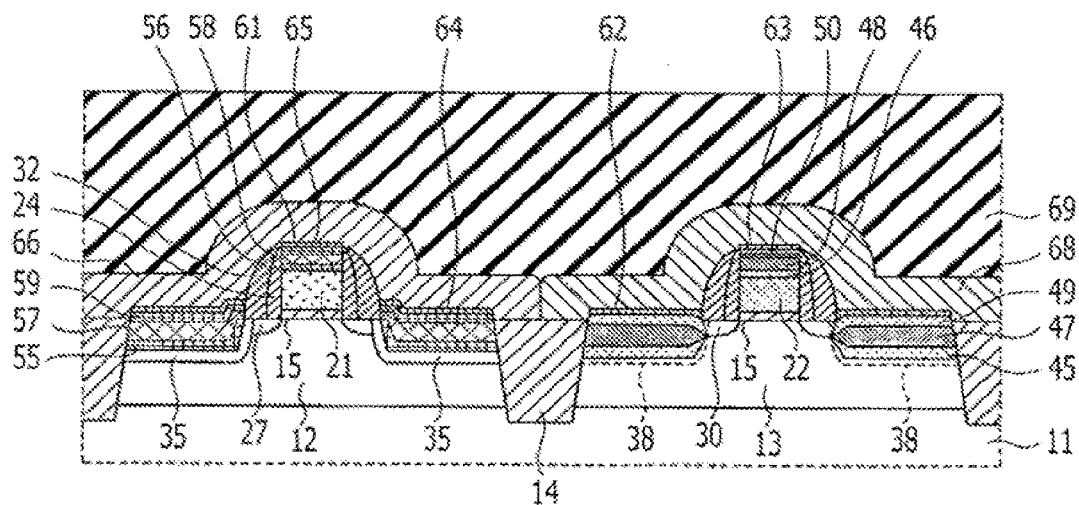
Figure 8A:
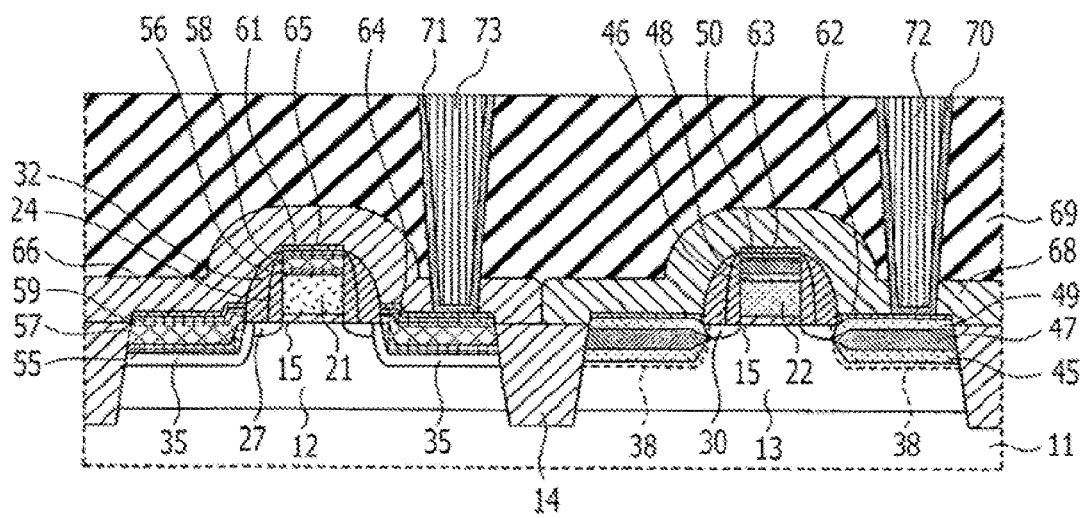
Figure 9:
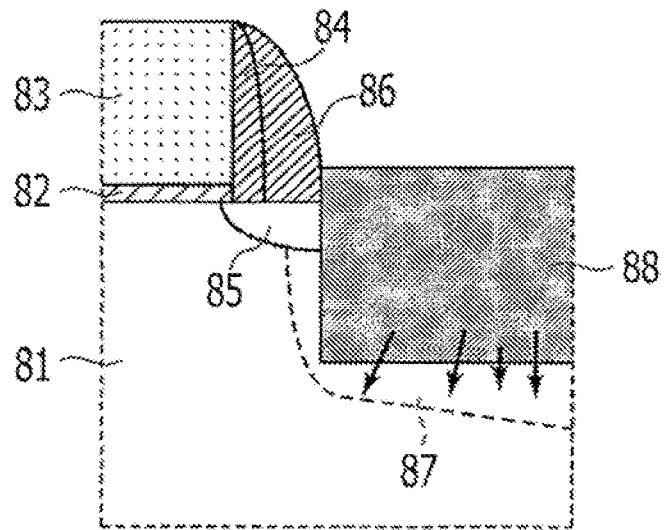
FIG. 9 is a sectional view of a major portion of a SiGe buried channel MOSFET in a related art.

As illustrated in FIG. 8Z, an n-type SiC layer 59 with a P concentration of $5.0\times10^{21}$ cm$^{-3}$ to $1.0\times10^{22}$ cm$^{-3}$ is epitaxially grown over the n+ type SiC layer 57. At approximately the same time, an n type SiC layer 60 is also formed over the n+ type SiC layer 58 over the n type gate electrode 21.

As illustrated in FIG. 8AA, for example, a Ni film 61 of 10 nm to 20 nm is formed by the low-temperature CV device. The Ni film 61 may include 1% to 5% Pt. Instead of Ni, Co may be used.

As illustrated in FIG. 8AB, after forming a (NiPt)$_2$ Si phase Ni silicide layer by annealing at 200 deg. C. to 250 deg. C. for 60 seconds to 240 seconds, non-reacted Ni film 61 is removed, for example, by sulfuric acid. Moreover, a (NiPt)$_2$ Si phase Ni silicide layer is changed into a (NiPt) Si phase Ni silicide layers 62 to 65 with lower resistance by annealing at 380 deg. C. to 420 deg. C. for 20 seconds to 40 seconds. The (MR) Si phase Ni silicide layers 62 to 65 are formed with a thickness of 10 nm to 15 nm and upper layer of the p-type SiGe layers 49 and 50 and the n-type SiC layers 59 and 60 become silicide.

As illustrated in FIG. 8AC, a tensile stress film 66 of 30 nm to 100 nm is formed by using the low-temperature CVD device or an HDP device at 350 deg. C. to 450 deg. C. For example, a silicon nitride film may be used as the tensile stress film 66.

As illustrated in FIG. 8AD, a resist pattern 67 is formed so as to cover the p-type well region 12 and the tensile stress film 66 of the n-type well region 13 is removed by using the resist pattern 67 as a mask. As a result, tensile stress is applied to the n-channel MOSFET.

As illustrated in FIG. 8AE, a compressive stress film 68 of 30 nm to 100 nm is formed by using the low-temperature CVD device or an HDP device at 350 deg. C. to 450 deg. C. As the compressive stress film 68, for example, a silicon nitride film may be used.

Although, not illustrated, a resist pattern is formed so as to cover the compressive stress film 68 over the n-type well region 13, the compressive stress film 68 over the p-type well region 12 is removed by using the resist pattern as a mask. As a result, compressive stress is applied to the p-channel MOSFET.

As illustrated in FIG. 8AF, an interlayer dielectric film 69 of 100 nm to 600 nm is formed at 350 deg. C. to 450 deg. C. As illustrated in FIG. 8AG, a via hole that reaches the Ni silicide layers 62 and 64 is formed, and (W) TiN films 70 and 71, and Tungsten (W) 72 and 73 are formed in the via hole. After that by repeating processes to form a wiring and an interlayer insulating film according to a multilayer wiring structure, a semiconductor device according to the first embodiment is completed.

As described above, according to the embodiment, the buried Si mixed source/drain region is made of a three-layer stack structure of a low impurity concentration layer/a high impurity concentration layer/a low impurity concentration layer. Thus, parasitic resistance may be reduced by the high impurity concentration layer. Moreover, an increase in leak current due to diffusion of impurities may be suppressed by the lower low impurity concentration layer. Furthermore, silicide resistance may be reduced because the upper Si mixed crystal layer is low impurity concentration layer. All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

What is claimed is:

1. A semiconductor device manufacturing method comprising:
   forming a gate insulating film over a first conductive type silicon substrate;
   forming a gate electrode over the gate insulating film;
   forming a first sidewall spacer at a sidewall of the gate electrode;
   implanting a first impurity with a second conductive type to the silicon substrate by using the first sidewall spacer as a mask;
   forming a second sidewall spacer at the first sidewall spacer;
   implanting a third impurity with the second conductive type to the silicon substrate by using the second sidewall spacer as a mask to form a second diffusion region over the silicon substrate;
   forming a trench portion in the silicon substrate by etching the silicon substrate by using the sidewall spacer as a mask;
   forming a first Si mixed crystal layer that includes a second impurity with a first concentration in the trench portion;
   forming a second Si mixed crystal layer that includes the second impurity with a second concentration higher than the first concentration over the first Si mixed crystal layer; and
   forming a third Si mixed crystal layer that includes the second impurity with a third concentration lower than the second concentration over the second Si mixed crystal layer.

2. The semiconductor device manufacturing method according to claim 1, wherein the forming the second diffusion region over the silicon substrate being after forming the second sidewall spacer and prior to forming the trench portion.

3. The semiconductor device manufacturing method according to claim 1 further comprising: forming a silicide layer over the third Si mixed crystal layer.

4. The semiconductor device manufacturing method according to claim 1, wherein the first conductive type is an n-type, the second conductive type is a p-type, and the Si mixed crystal layer is a p-type SiGe layer.

5. The semiconductor device manufacturing method according to claim 1, wherein the first conductive type is a p-type, the second conductive type is an n-type, and the Si mixed crystal layer is one of an n-type SiC layer and an n-type SiGeC layer.

* * * * *